US010256337B2

(12) United States Patent
Kawahara et al.

(10) Patent No.: US 10,256,337 B2
(45) Date of Patent: Apr. 9, 2019

(54) POWER TRANSISTOR WITH TERMINAL TRENCHES IN TERMINAL RESURF REGIONS

(71) Applicant: Texas Instruments Incorporated, Dallas, TX (US)

(72) Inventors: Hideaki Kawahara, Plano, TX (US); Christopher Boguslaw Kocon, Mountain Top, PA (US); Seetharaman Sridhar, Richardson, TX (US); Simon John Molloy, Allentown, PA (US); Satoshi Suzuki, Ibaraki (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 103 days.

(21) Appl. No.: 15/427,489

(22) Filed: Feb. 8, 2017

(65) Prior Publication Data
US 2018/0226502 A1 Aug. 9, 2018

(51) Int. Cl.
H01L 29/78 (2006.01)
H01L 29/10 (2006.01)
H01L 29/40 (2006.01)

(52) U.S. Cl.
CPC ...... H01L 29/7802 (2013.01); H01L 29/1095 (2013.01); H01L 29/407 (2013.01); H01L 29/7834 (2013.01)

(58) Field of Classification Search
CPC ............ H01L 29/7803; H01L 29/7802; H01L 29/407; H01L 29/66712; H01L 29/66734; H01L 29/7811
See application file for complete search history.

(56) References Cited

U.S. PATENT DOCUMENTS 9,525,035 B2 12/2016 Kocon et al.
2011/0115033 A1* 5/2011 Tamaki ............... H01L 29/0619 257/409
2013/0193502 A1* 8/2013 Kocon ................ H01L 29/7811 257/302

* cited by examiner

Primary Examiner — Jose R Diaz
(74) Attorney, Agent, or Firm — Tuenlap Chan; Charles A. Brill; Frank D. Cimino

(57) ABSTRACT

A device includes a transistor formed on a substrate. The transistor includes an n-type drain contact layer, an n-type drain layer, an oxide layer, a p-type body region, a p-type terminal region, body trenches, and terminal trenches. The n-type drain contact layer is near a bottom surface of the substrate. The n-type drain layer is positioned on the n-type drain contact layer. The oxide layer circumscribes a transistor region. The p-type body region is positioned within the transistor region. The p-type terminal region extends from under the oxide layer to an edge of the transistor region, thereby forming a contiguous junction with the p-type body region. The body trenches is within the transistor region and interleaves with the p-type body region, whereas the terminal trenches is outside the transistor region and interleaves with the p-type terminal region.

20 Claims, 16 Drawing Sheets

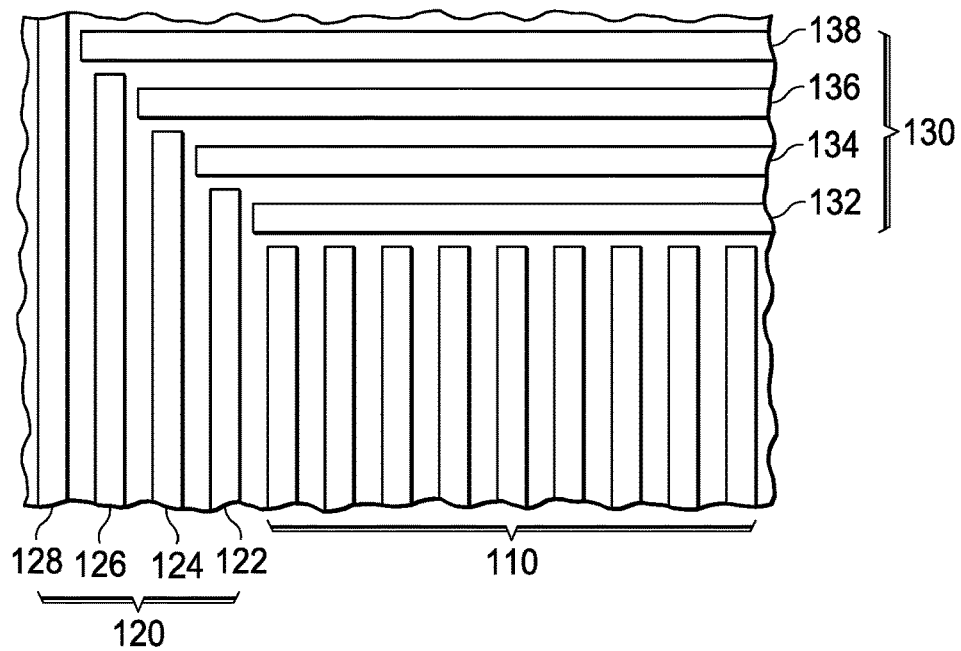
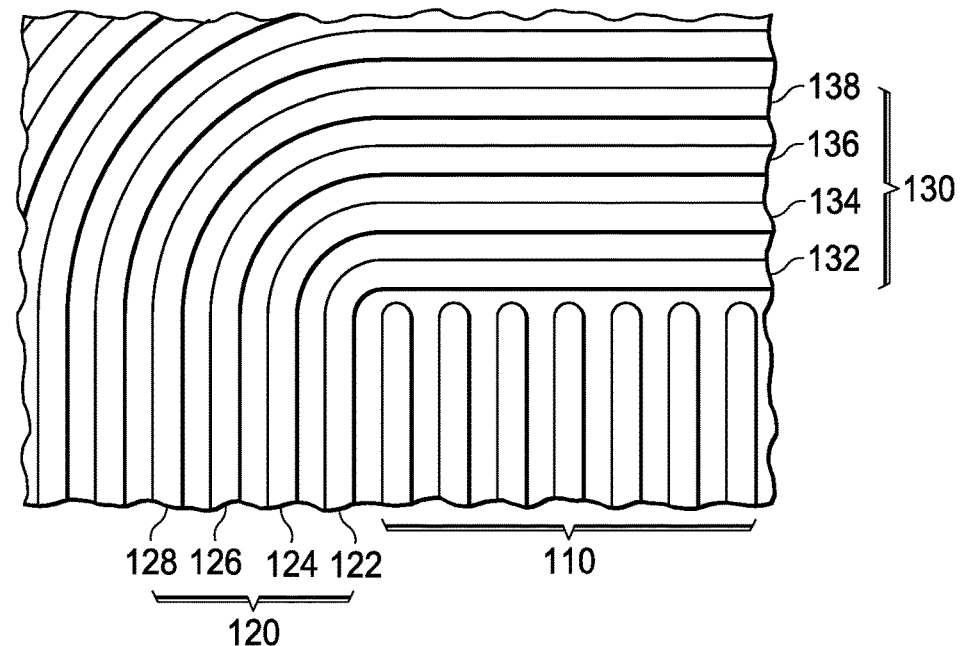

US 10,256,337 B2

POWER TRANSISTOR WITH TERMINAL TRENCHES IN TERMINAL RESURF REGIONS

BACKGROUND

Circuits with high voltage capabilities have wide industrial applications, which include power management systems for use in automobiles. These circuits include power transistors (e.g., high voltage transistor) that operate at a high voltage range (e.g., above 100V) and may also include low voltage transistors that operate at a much lower voltage range (e.g., 1v to 5V). To protect low voltage transistors from high voltage operations, the power transistor may adopt one or more isolation schemes. For instance, one isolation scheme involves forming an isolation structure around a power transistor. The isolation structure may include one or more terminal trenches in a peripheral region that surrounds a transistor region of the power transistor. During high voltage operations, the junctions between the peripheral region and the transistor region may experience a heightened electrical field density, thereby causing a reduction in breakdown voltage. And in certain situations, the reduced breakdown voltage may lead to low level current leakage from the transistor region.

SUMMARY

The present disclosure describes systems and techniques relating to the manufacturing of a semiconductor device that can handle high voltage operations (e.g., above 500V). The semiconductor device may be a standalone discrete component or incorporated as a part of an integrated circuit. The semiconductor device adopts an isolation scheme to protect low voltage transistors from high voltage operations. The disclosed isolation scheme allows the high voltage transistors to operate at a high voltage range while reducing the voltage stress between a transistor region and a terminal region that surrounds and isolates the transistor region. Advantageously, the disclosed isolation scheme provides a low-cost and high-performance solution to alleviate junction breakdowns and current leakages of the semiconductor device.

DRAWING DESCRIPTIONS

FIG. 2A shows a partial top view of a corner region of the transistor device according to an aspect of the present disclosure.

FIG. 2B shows a partial top view of a corner region of the transistor device according to another aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
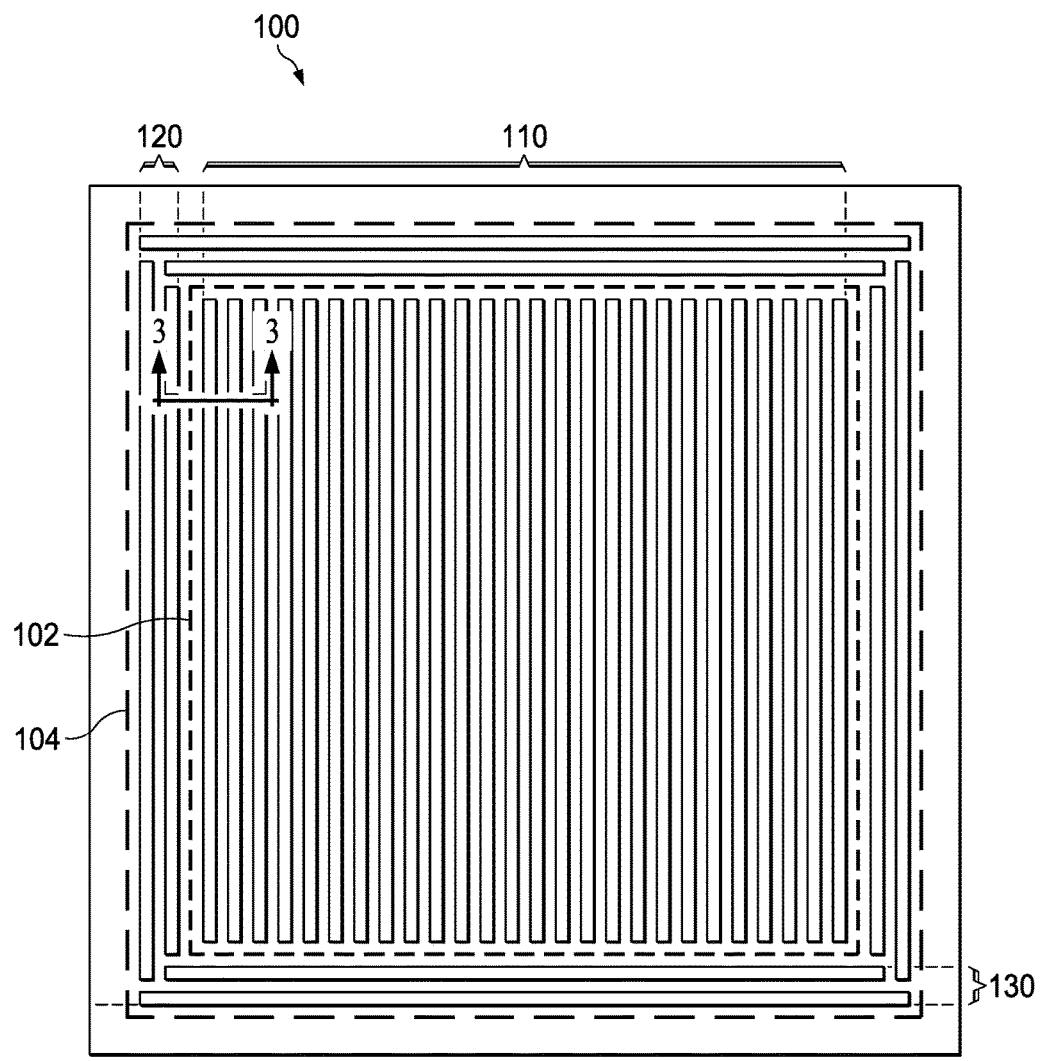
FIG. 1 shows a partial top view of a transistor device according to an aspect of the present disclosure.

FIG. 1 shows a partial top view of a transistor device 100 according to an aspect of the present disclosure. The transistor device 100 may be a standalone discrete device fabricated on a single semiconductor die. Alternatively, the transistor device 100 may be incorporated to one or more circuits fabricated on a single integrated circuit die.

The transistor device 100 is formed on a substrate (e.g., 302 in FIG. 3) that has a top surface (e.g., 304 in FIG. 3) defining a transistor region 102 and a peripheral region 104. In general, the transistor region 102 is where the active components of a power transistor are located, whereas the peripheral region 104 serves as a terminal region of the transistor 102 and provide insulation therefrom. In one implementation, for example, the peripheral region 104 laterally surrounds the transistor region 102.

The transistor device 100 includes one or more transistor body trenches (e.g., first trenches) 110, which are located within the transistor region 102. The transistor body trenches 110 may align in parallel with each other along a longitudinal direction of the top surface. The transistor device 100 also includes one or more terminal trenches (e.g., second trenches) 120 and 130, which are located within the peripheral region 104. In general, the terminal trenches 120 and 130 laterally surround the transistor region 102, and thus the transistor body trenches 110 as well. More particularly, the longitudinal terminal trenches 120 extend the longitudinal direction and thus in parallel to the transistor body trenches 110. By contrast, the traverse terminal trenches 130 extend in a traverse direction and thus perpendicularly to the transistor body trenches 110.

FIG. 2A shows a partial top view of a corner region (e.g., top left corner region) 103 of the transistor device 100 according to an aspect of the present disclosure. In this configuration, the terminal trenches 120 and 130 have an orthogonal alignment, which allows the traverse terminal trenches 130 to stagger the longitudinal terminal trenches 120 along the corner region 103. For example, traverse terminal trenches 132, 134, 136, and 138 are arranged in a zigzag order with longitudinal terminal trenches 122, 124, 126, and 128 without contacting one another.

Because the terminal trenches 120 and 130 can be filled with epitaxially grown materials, this orthogonal staggering pattern may help reduce stacking faults that are associated with the epitaxial growth process. Advantageously, the stacking fault reduction may help reduce the sensitivity of a charge balance across a corner junction (e.g., the corner region 103) between the transistor region 102 and the peripheral region 104. By enhancing an immunity against unbalanced charge share in the corner junction, the orthogonal staggering pattern may also improve the breakdown voltage and current leakage of the transistor device 100.

When the terminal trenches (e.g., 120 and 130) have sufficiently large aspect ratio (e.g., a width-to-depth ratio greater than 10:1), the risk of stacking faults may be reduced significantly as well. As such, the terminal trenches may be arranged in a racetrack pattern as shown in FIG. 2B. In this racetrack pattern, for example, traverse terminal trenches 132, 134, 136, and 138 are contiguously connected to longitudinal terminal trenches 122, 124, 126, and 128 around the corner region 103.

Figure 3:
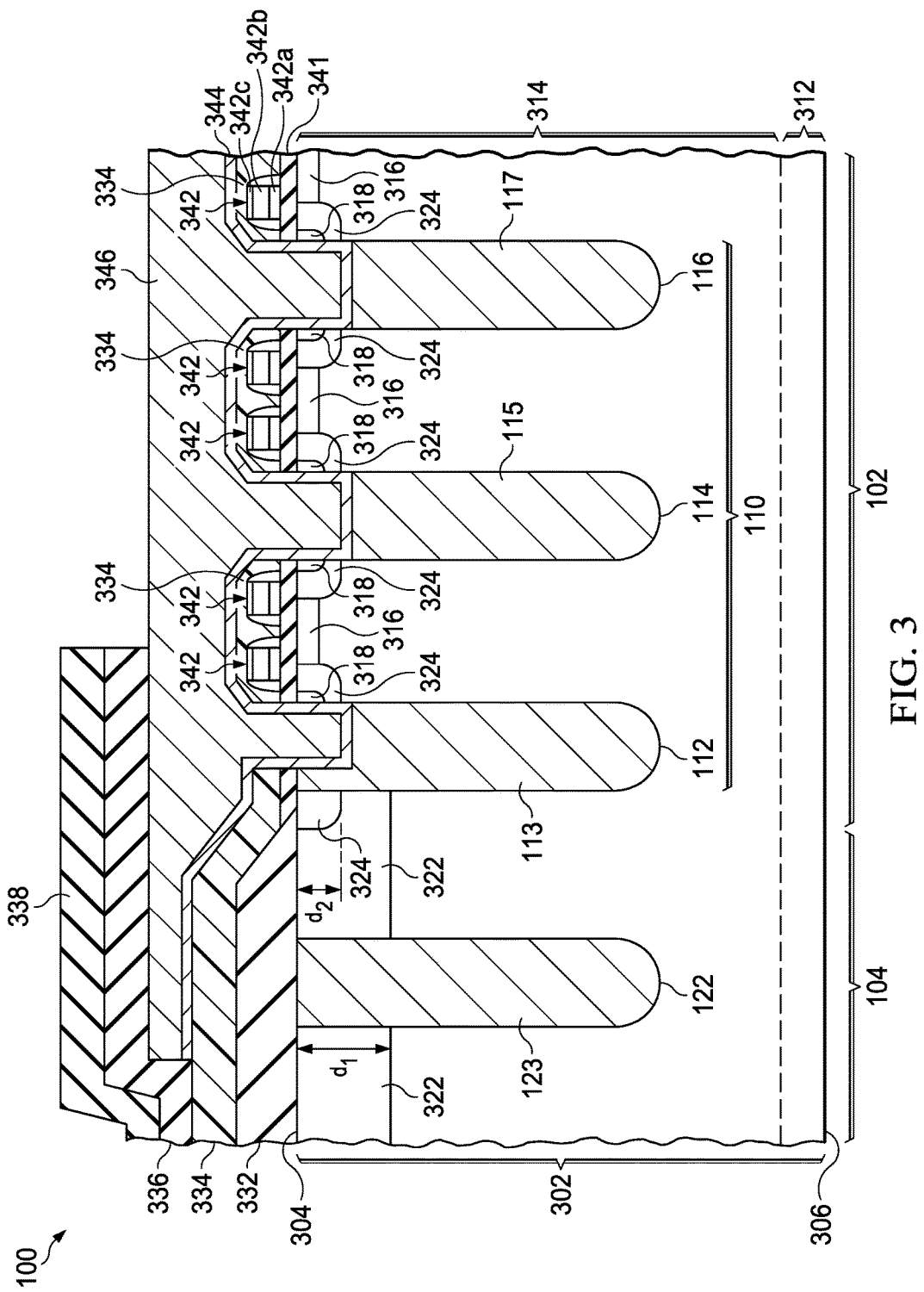
FIG. 3 shows a cross-sectional view of a junction between a peripheral region and a transistor region of the transistor device according to an aspect of the present disclosure.

To enhance reliability and performance, the transistor device 100 includes one or more super junction structures with reduced surface field (RESURF) capabilities in between the peripheral region 104 and the transistor region 102. Referring to FIG. 3, for example, a cross-sectional junction between the peripheral region 104 and the transistor region 102 of the transistor device 100 includes such RESURF capabilities. Consistent with the above description, the transistor device 100 includes a semiconductor substrate 302, which has a top surface 304 and a bottom surface 306. The substrate 302 can be a single bulk substrate or a wafer with multiple epitaxial layers developed thereon. The transistor device 100 is a vertical device because a drain-to-source current path thereof extends from the bottom surface 304 to the top surface 306 of the substrate 302.

In general, the drain region of the transistor device 100 includes a drain contact layer 312, a drain drift layer 314, and optionally one or more lightly doped drain (LDD) regions 316. Where the transistor device 100 is an n-channel device, the drain contact layer 312 can be an n-type layer near the bottom surface 306, and it may have a heavy n++ doping (e.g., $1\times10^{19}$ cm$^{-3}$ or greater). Similarly, the drain drift layer 314 can be an n-type layer, which is positioned on the drain contact layer 312. The drain drift layer 314 has a doping concentration (e.g., from $1\times10^{15}$ cm$^{-3}$ to $2\times10^{16}$ cm$^{-3}$) that is lower than the drain contact layer 312. Where the drain contact layer 312 is formed on a starter wafer, the drain drift layer 314 may be grown epitaxially thereon. Alternatively, where the drain contact layer 312 is formed as a doped region on a bulk substrate, the drain drift layer 314 may also be formed as a doped region above the drain contact layer 312. Each of the LDD regions 316 is positioned among an upper portion of the drain drift layer 314 and near the top surface 304 of the substrate 302. Like the drain drift layer 314, each of the LDD regions 316 is also n-doped but has a doping concentration Ldd doping (e.g., from $1\times10^{16}$ cm$^{-3}$ to $1\times10^{17}$ cm$^{-3}$) that is heavier than the drain drift layer 314.

The transistor device 100 includes one or more body regions 324 that interface with the drain drift layer 314 and optionally the LDD regions 316. Where the drain region is n-type, the body regions 324 can be p-type. The body regions 324 are positioned within the transistor region 102 and near the top portion of the drain drift layer 314. Collectively, the body regions 324 can be a first p-doped region that abuts the transistor body trenches 110. As shown in an example configuration of FIG. 3, each of the transistor body trenches 112, 114, and 116 interleaves the body regions 324 within the transistor region 102.

The transistor device 100 includes one or more source regions 318 that are separated from the drain region (e.g., 312, 314, and 316) by the body regions 324. In one implementation, for example, each of the source regions 318 may be positioned within a corresponding one of the body regions 324 and near the top surface 304 of the substrate. Like the drain region, the source regions 318 is also n-doped, and it may has a doping concentration (e.g., from $1\times10^{19}$ cm$^{-3}$ to $5\times10^{19}$ cm$^{-3}$) that is higher than the LDD regions 316, which is positioned outside of the body regions 324.

The transistor device 100 includes a drain dielectric layer 332 on the top surface 304 above the drain drift layer 314. The drain dielectric layer 332 may be an oxide layer that circumscribes the transistor region 102 and demarcates a boundary of the peripheral region 104. Consistent with the description of FIG. 1, the transistor body trenches (e.g., first trenches) 110 are positioned within the transistor region 102, and they extend from the top surface 304 to partially penetrate the n-doped drain drift layer 314. Moreover, the terminal trench (e.g., second trench) 122 is positioned within the peripheral region 104 and coextend with the transistor body tranches 110 to partially penetrate the n-doped drain drift layer 314. Each of the terminal trenches 120 and 130, as well as the transistor body trenches 110, is filled with a conductive material to form a field plate. In one implementation, for example, the conductive material may be a p-doped epitaxial layer. As such, a terminal field plate 123 is positioned within the terminal trench 122, and transistor field plates 113, 115, and 117 are positioned within the transistor body trenches 112, 114, and 116 respectively.

The transistor device 100 includes one or more gate structures 342 positioned above the top surface 304 and between two adjacent transistor body trenches, such as transistor body trenches 112 and 114. A stress relief layer 334 is deposited to cover the gate structures 342 and the drain dielectric layer 332. For accessing the source regions 318 and the body regions 324, the transistor device 100 includes a source metal layer 346 above the gate structures 342 and the stress relief layer 334. The source metal layer 346 penetrates a top portion of the transistor field plates 113, 115, and 117, thereby making ohmic contacts with the source regions 318 and the body regions 324. The transistor device 100 may also include insulation layers 336 and 338 for protecting the underlying structures.

The transistor device 100 includes means for reducing the surface field density around a device junction (e.g., the corner region 103 as shown in FIG. 2A and 2B) between the transistor region 102 and the peripheral region 104. In addition to, or as an alternative to, the staggering pattern of the terminal trenches 120 and 130 as described in FIG. 2A, the transistor device 100 may include a terminal region 322 to relief the surface field density around the device junction. In general, the terminal region 322 has the same conductivity type as the body regions 324, which is opposite to the drain regions 312, 314, and 316 and the source regions 318. For instance, the terminal region 322 can be a second p-doped region that is formed either before or after the first p-doped region (e.g., the body regions 324). In one implementation, the terminal region 322 may be formed around the junctions at one or more corner regions, such as the corner region 103, of the transistor device 100. In another implementation, the terminal region 322 may be formed to laterally surround the transistor region 102.

The terminal region 322 is adjacent to the top surface 304 and extends from under the drain dielectric layer 332 to an edge of the transistor region 102. The terminal region 322 forms a contiguous junction with the body region 324, and thus, the terminal region 322 may abut both the terminal trench 122 and the transistor body trench 112. As the terminal region 322 may extend beyond the terminal trench 122 away from the transistor region 102, two or more terminal trenches 120 as shown in FIGS. 1 and 2A-2B may interleave with the terminal region 322.

While the body region (e.g., the first p-doped region) 324 terminates around the boundary demarcated by the drain dielectric layer 332, the terminal region (e.g., the second p-doped region) 322 extends across that boundary. As such, the terminal region 322 is interposed between the body region 324 and the terminal trench 122. In general, the terminal region 322 is diffused to a greater depth than the body region 324 for reducing the surface field density of the transistor device 100. In one implementation, for example, the terminal region 322 may have a diffusion depth d1 ranging from 0.2 um to 3.0 um, whereas as the body region 324 may have a diffusion depth d2 ranging from 0.3 um to 1 um. Moreover, the terminal region 322 may have a lower doping concentration than the body region 324 to reduce the surface field density of the transistor device 100. In one implementation, for example, the terminal region 322 may have a doping concentration ranging from $1 \times 10^{16}$ cm$^{-3}$ to $3 \times 10^{16}$ cm$^{-3}$, whereas the body region 324 may have a doping concentration ranging from $1 \times 10^{17}$ cm$^{-3}$ to $3 \times 10^{17}$ cm$^{-3}$.

The terminal region 322 serves as a RESURF region that enhances the immunity of unbalanced charge share around the corner regions (e.g., the corner region 103) of the transistor device 100. Advantageously, the terminal region 322 helps enhance the breakdown voltage of the pn junctions (e.g., the body region 324 to the drain drift layer 314) and thus minimize leakage currents during high voltage operations.

Although certain layers and regions in FIG. 3 are designated with a particular conductivity type provided that the transistor device 100 is an n-channel device, the opposite conductivity type may be assigned to these layers and regions where the transistor device 100 is a p-channel device. For instance, in an alternative implementation where the transistor device 100 is a p-channel device, the drain regions 312, 312, and 316 are p-doped regions, the body regions 324 are n-doped regions, the source regions 318 are p-doped regions, and the terminal regions 322 are n-doped regions.

Figure 4A:
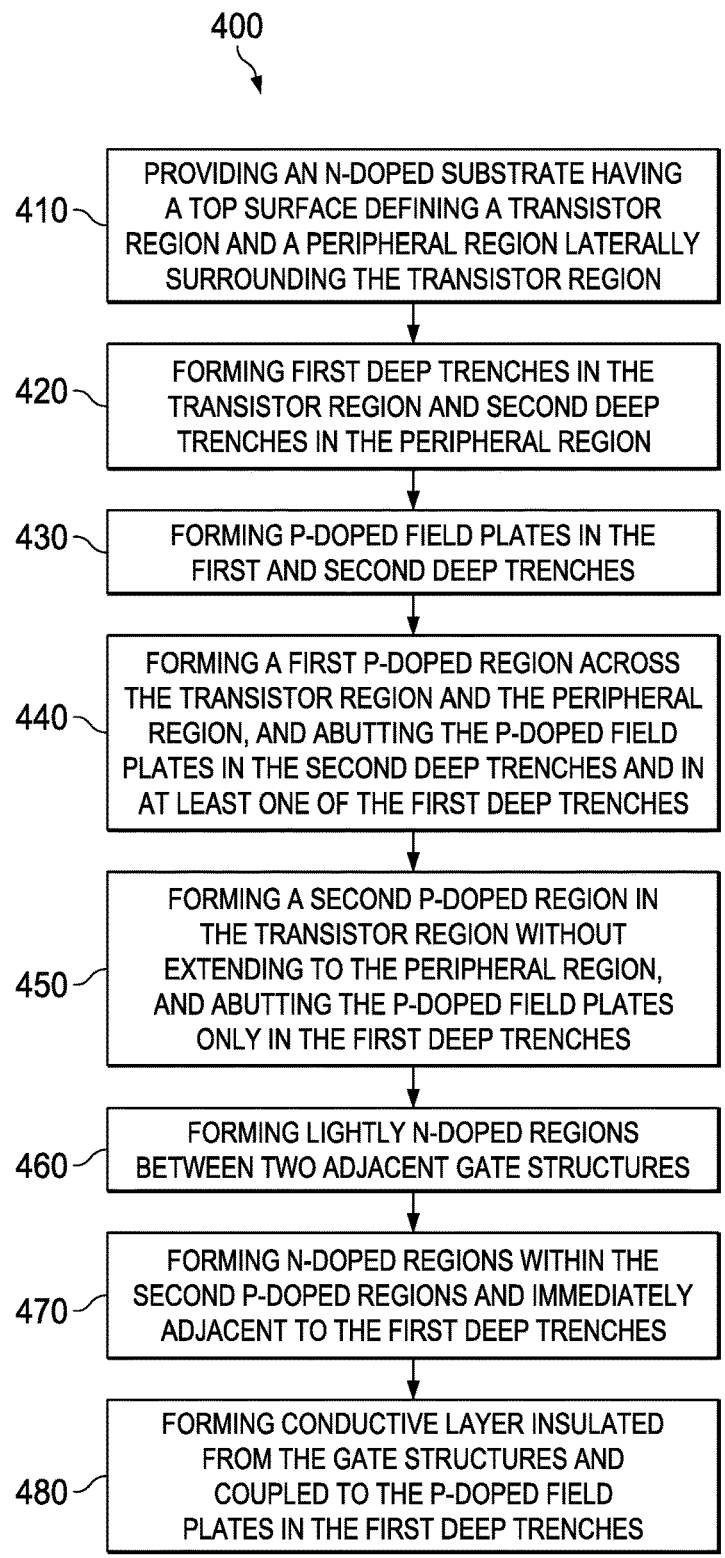
FIGS. 4A-4C show flow charts of a method for manufacturing the transistor device according to an aspect of the present disclosure.
Figure 4B:
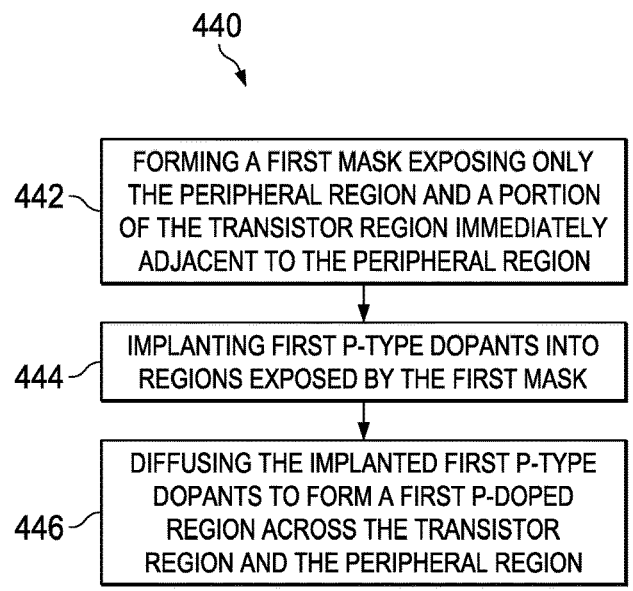
Figure 5A:
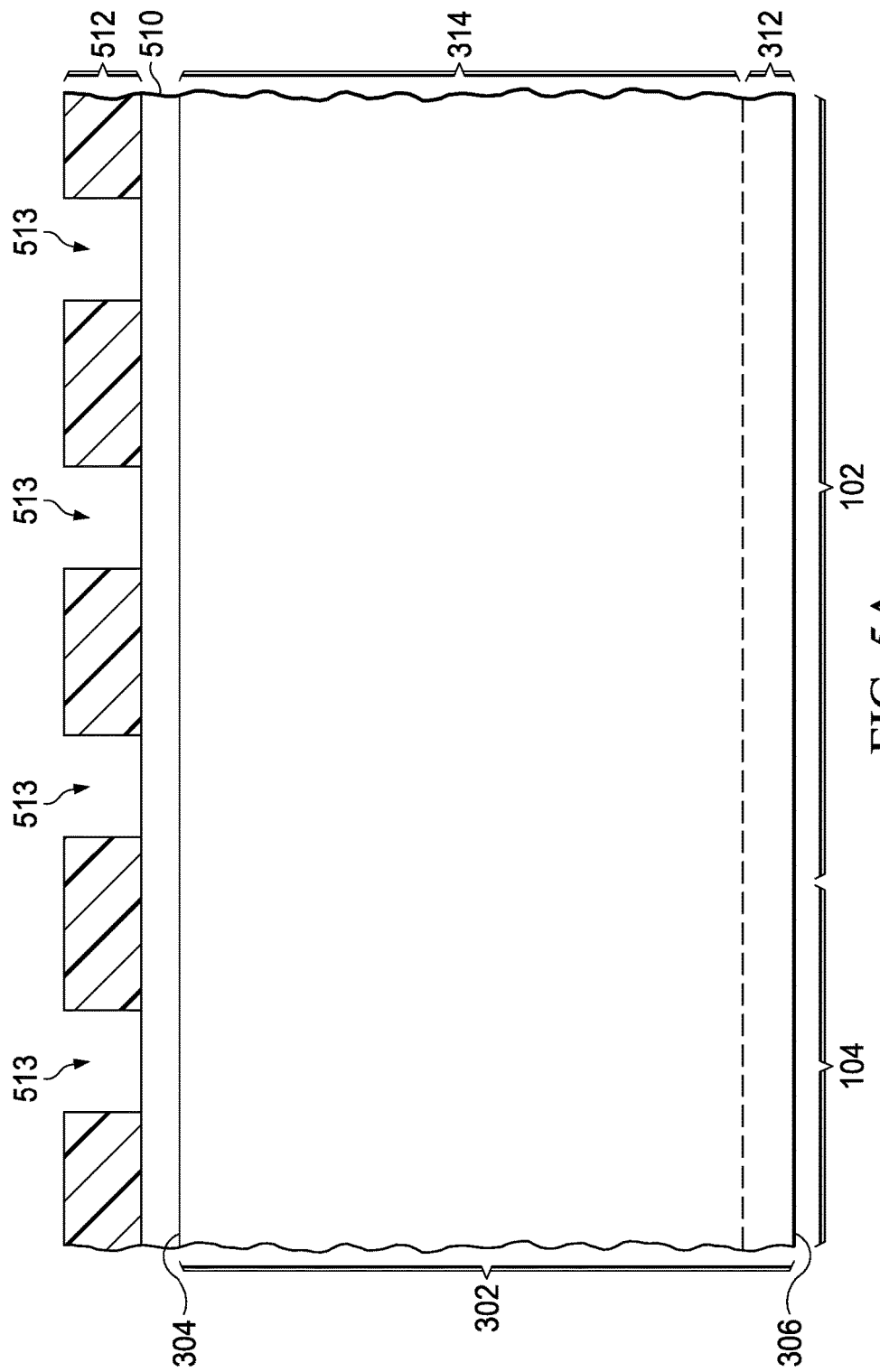
FIGS. 5A-5K show cross-sectional views of the transistor device during the manufacturing process according to an aspect of the present disclosure.

Turning to FIGS. 4A-4B, the present disclosure introduces a method 400 for manufacturing the transistor device 100 consistent with the descriptions of FIGS. 1, 2A-2B, and 3. The method 400 may begin at step 410 and terminate at step 480. Step 410 involves providing an n-doped substrate. As shown in FIG. 5A, for example, a semiconductor substrate 302 is provided with a n++ doped layer (i.e., heavily doped n-type layer) 312 and an n-doped layer 314. The n++ doped layer 312 may be a starter wafer having a doping concentration ranging from $1 \times 10^{19}$ cm$^{-3}$ to $5 \times 10^{19}$ cm$^{-3}$. The n-doped layer 314 may be developed on the n++ doped layer 312 by means of an epitaxial growth with phosphorous, arsenic, and/or antimony dopants. The n-doped layer 314 may have a doping concentration ranging from $1 \times 10^{15}$ cm$^{-3}$ to $2 \times 10^{16}$ cm$^{-3}$. Consistent with the description of FIGS. 1, 2A-2B, and 3, the substrate 302 has a top surface 304 and a bottom surface 306, either of which may define a transistor region 102 and a peripheral region 104 that laterally surrounds the transistor region 102.

Upon completing step 410, the method 400 proceeds to step 420, which involves forming first deep trenches in the transistor region and second deep trenches in the peripheral region. As shown in FIG. 5A, for example, a hard mask 510 is formed on a top surface 304 of the substrate 302. The hard mask 510 may be formed by the oxidization of, or by deposition of silicon oxide onto, the top surface 304. A patterned photoresist layer 512 is formed on the hard mask 510. The patterned photoresist layer 512 defines openings 513 for forming the terminal trenches (i.e., second deep trenches) 120 and 130 in the peripheral region 104 and for forming the transistor body trenches (i.e., first deep trenches) 110 in the transistor region 102.

Figure 5B:
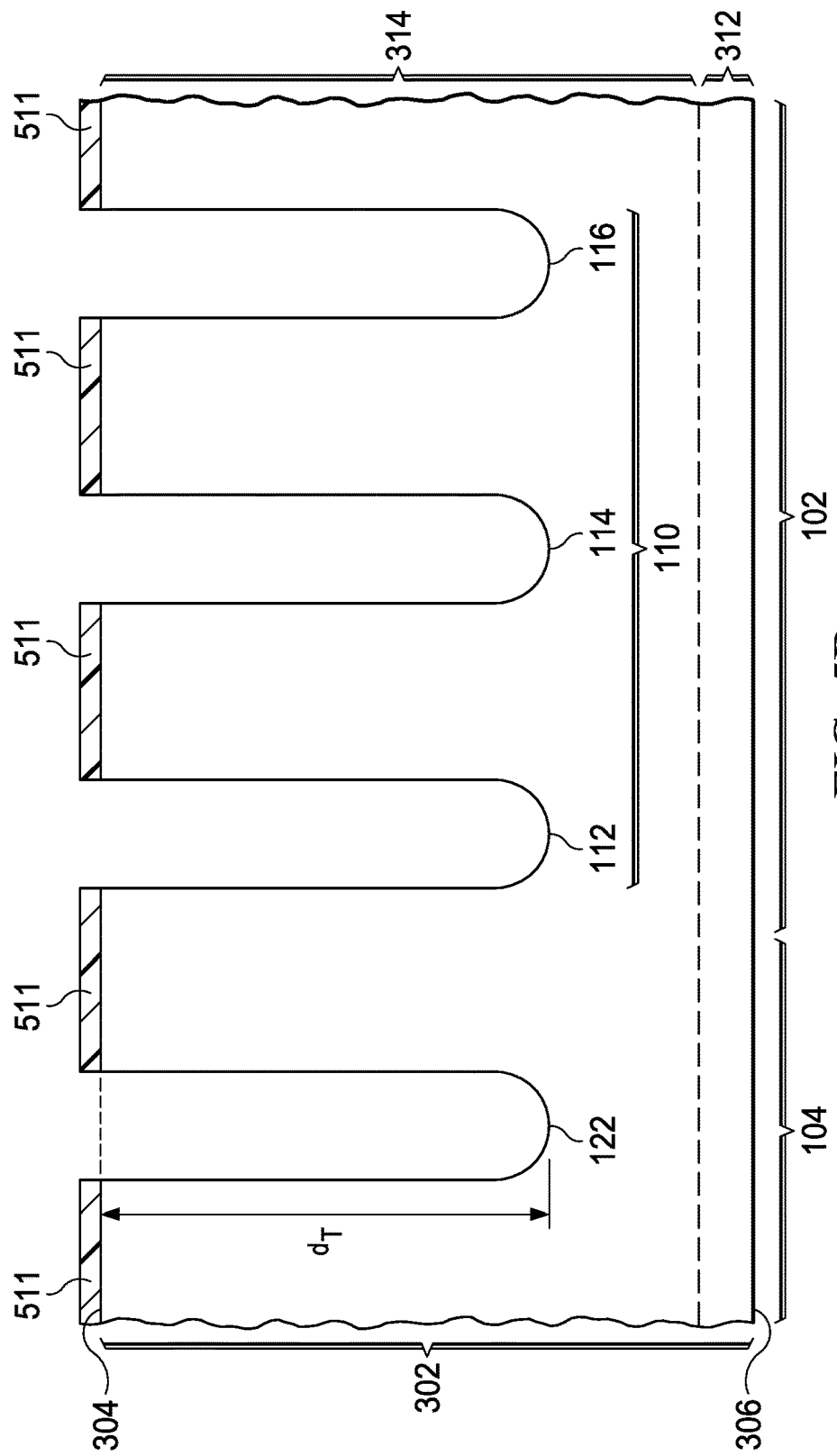

During a lithography process, portions of the hard mask 510 exposed by the patterned photoresist layer 512 are etched. After the etching, a patterned hard mask 511 is formed. As shown in FIG. 5B, the patterned photoresist layer 512 is removed and the patterned hard mask 511 is cleaned. Then, a silicon etch is performed to etch from the top surface 304 exposed by the openings of the patterned hard mask 511. After the silicon etching, an array of deep trenches are formed. As shown in FIG. 5B, for example, the array of deep trenches includes the terminal trench 122 (as well as terminal trenches 120 and 130 as shown in FIG. 1), and the transistor body trenches 110, including the transistor body trenches 112, 114, and 116. Each of these deep trenches (e.g., 122, 112, 114, and 116) has a trench depth $d_T$ extends from the top surface 304 to penetrate a portion of the n-doped layer 314. In one implementation, the trench depth $d_T$ may range from 25 um to 100 um.

Figure 5C:
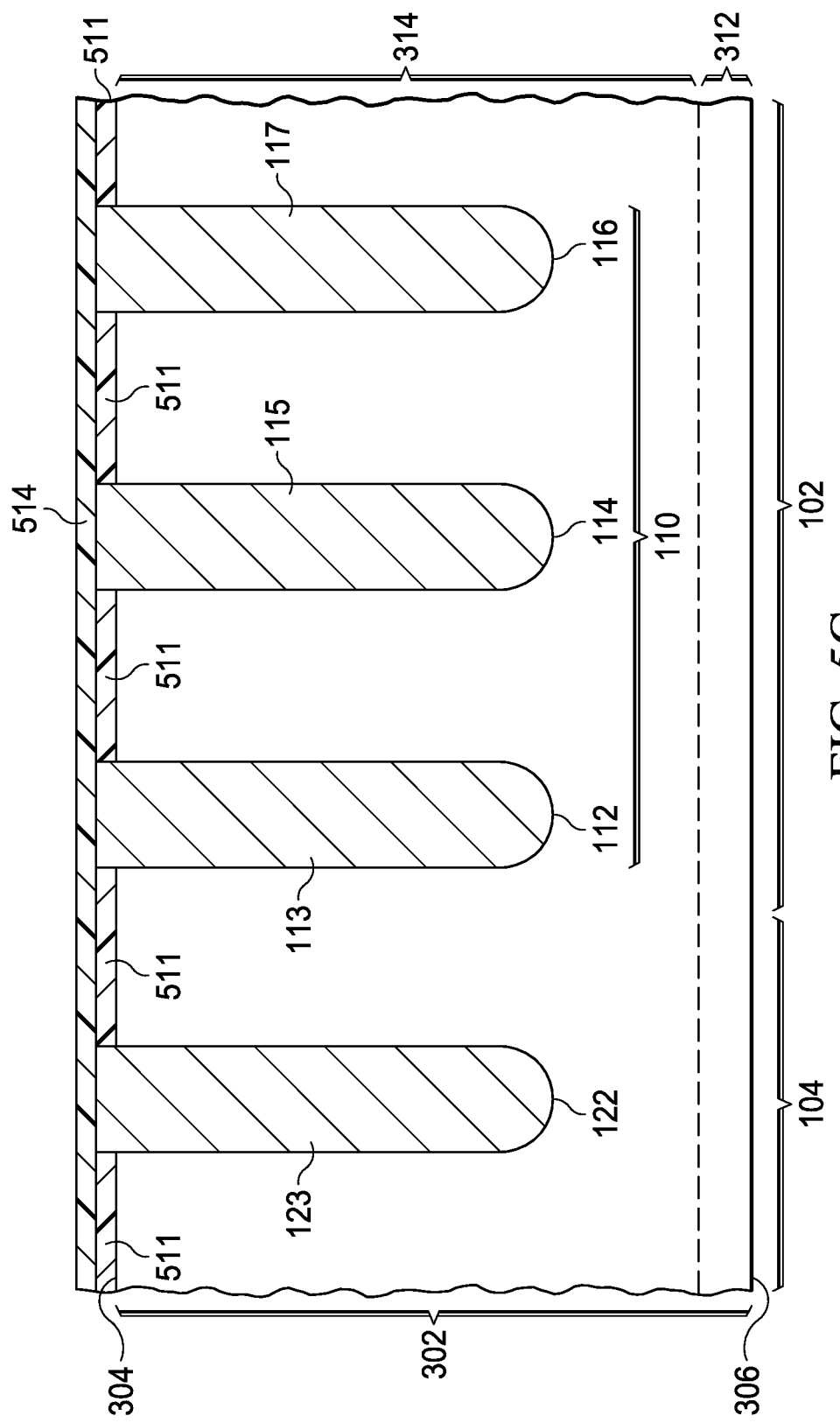

Upon completing step 420, the method 400 proceeds to step 430, which involves forming p-doped field plates in the first and second deep trenches. As shown in FIG. 5C, for example, a selective epitaxy process is performed to fill the deep trenches 122, 112, 114, and 116. The selective epitaxy process applies silicon doped with in situ p-type dopants (e.g., boron]) to the top surface 304, which is followed by a high temperature (e.g., 1050-1200° C.) hydrogen ($H_2$) and/or nitrogen ($N_2$) annealing process. As a result, p-doped field plates 123, 113, 115, and 117 are formed in trenches 122, 112, 114, and 116 respectively, and a p-type epitaxial layer 514 is formed above the patterned hard mask 511. In one implementation, a trench liner may be formed in trenches 122, 112, 114, and 116 prior to the formation of the p-doped field plates 123, 113, 115, and 117. The trench liner may include $SiO_2$.

Figure 5D:
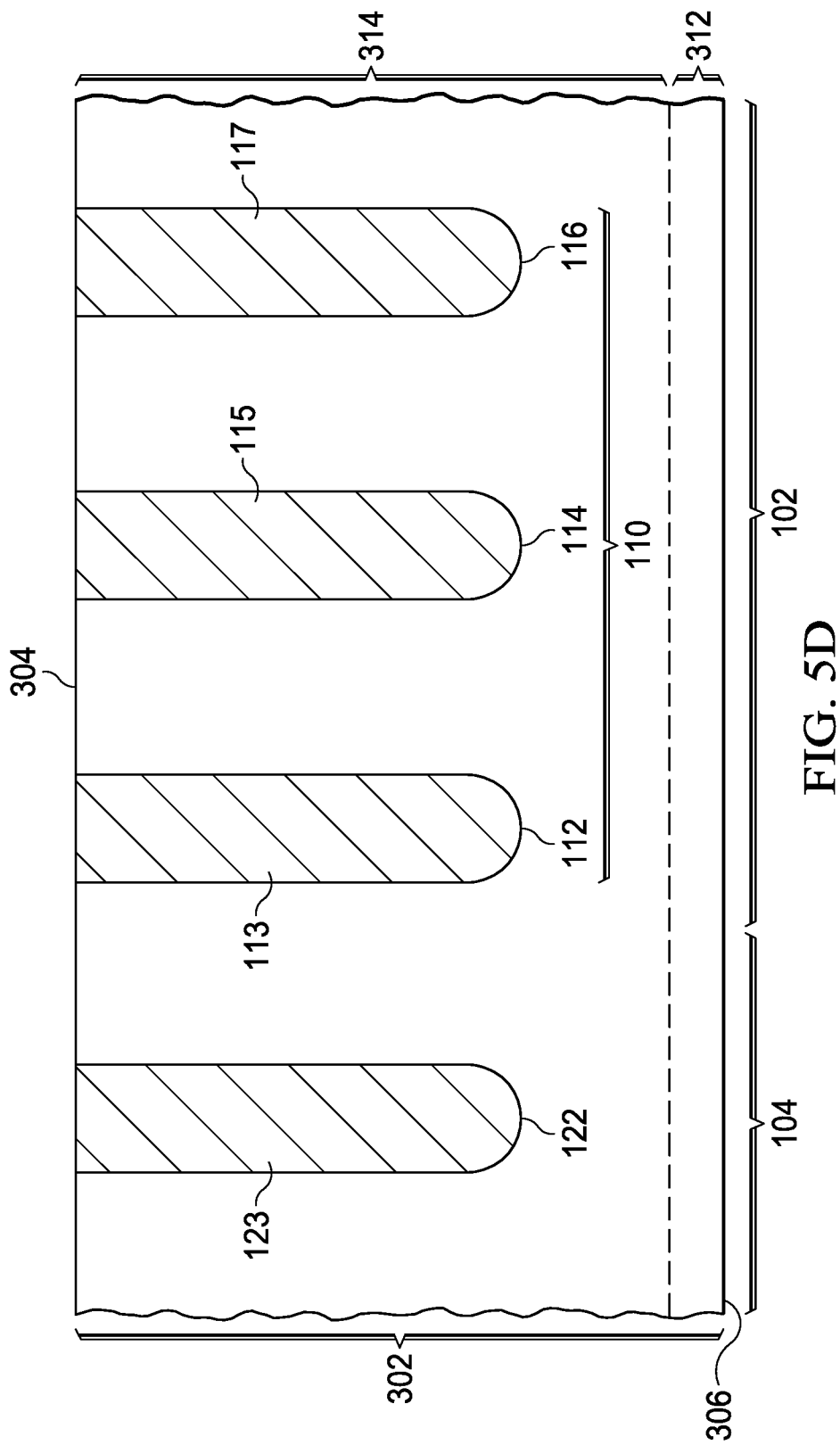

After the selective epitaxy, a chemical mechanical polish (CMP) process is performed to remove the p-type epitaxial layer 514 and the patterned hard mask 511. As shown in FIG. 5D, for example, the top surface 304 is free of the patterned hard mask 511 and the p-type epitaxial layer 514 after the CMP process. As such, the p-doped field plates 123, 113, 115, and 117 each has a top surface that levels with the top surface 304 of the substrate 302.

Upon completing step 430, the method 400 proceeds to step 440, which involves forming a first p-doped region across the transistor region and the peripheral region. The first p-doped region abuts the p-doped field plates in the second deep trenches and in at least one of the first deep trench. According to an aspect of the present disclosure, step 440 may be implemented by a process flow as outlined in FIG. 4B, which may begin at step 442 and terminate at step 446.

Figure 5E:
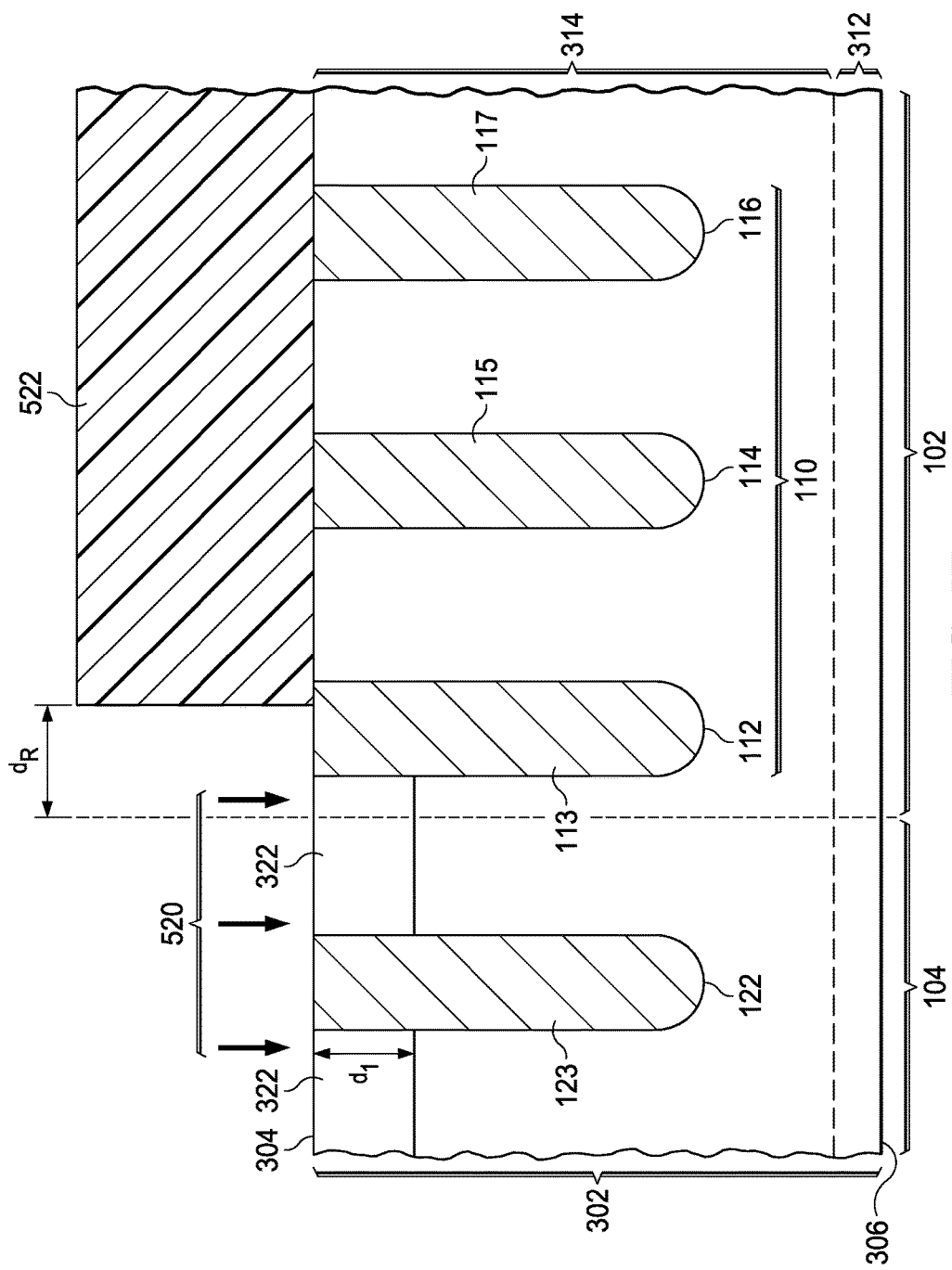

Step 442 involves forming a first mask exposing only the peripheral region and a portion of the transistor region immediately adjacent to the peripheral region. As shown in FIG. 5E, for example, a first mask 522 is formed within the transistor region 102. The first mask 522 may include a screen oxide layer formed by a thermal oxidation process. The first mask 522 recedes from the junction between the transistor region 102 and the peripheral region 104 by a recession distance $d_R$. In one implementation, the recession distance $d_R$ may range from 3 um to 6 um. In another implementation, the recession distance $d_R$ may be defined by a position of the transistor body trench 112, which is the nearest transistor body trench 110 to the junction.

Step 444 involves implanting first p-type dopants into regions exposed by the first mask. As shown in FIG. 5E, an isotropic implantation 520 is performed using one or more first p-type dopants. For example, the first p-type dopants may include boron. Because of the recession distance $d_R$, the isotropic implantation 520 may reach an outer edge of the transistor region 102, thereby allowing the first p-type dopants to be implanted into the peripheral region 104 as well as the outer edge of the transistor region 102. After the isotropic implantation 520 is performed, the first mask 522 is striped.

Step 446 involves diffusing the implanted first p-type dopants to form a first p-doped region across the transistor region and the peripheral region. As shown in FIG. 5E, for example, the first p-doped region (i.e., p-doped terminal region) 322 is formed after an activation annealing process is performed. The first p-doped region 322 extends under the top surface 304 and spans across the outer edge of the transistor region 102 from the peripheral region 104. The first p-doped region 322 servers as a terminal RESURF region for lowering the charge sensitivity of the transistor device 100 around the device junction between the transistor region 102 and the peripheral region 104. Horizontally, the first p-doped region 322 is interposed between at least one terminal trench, such as the terminal trench 122, and at least one transistor body trench, such as the transistor body trench 112. Vertically, the diffusion process causes the first p-doped region 322 to have a diffusion depth d1 that ranges from 0.2 um to 3 um.

Figure 4C:
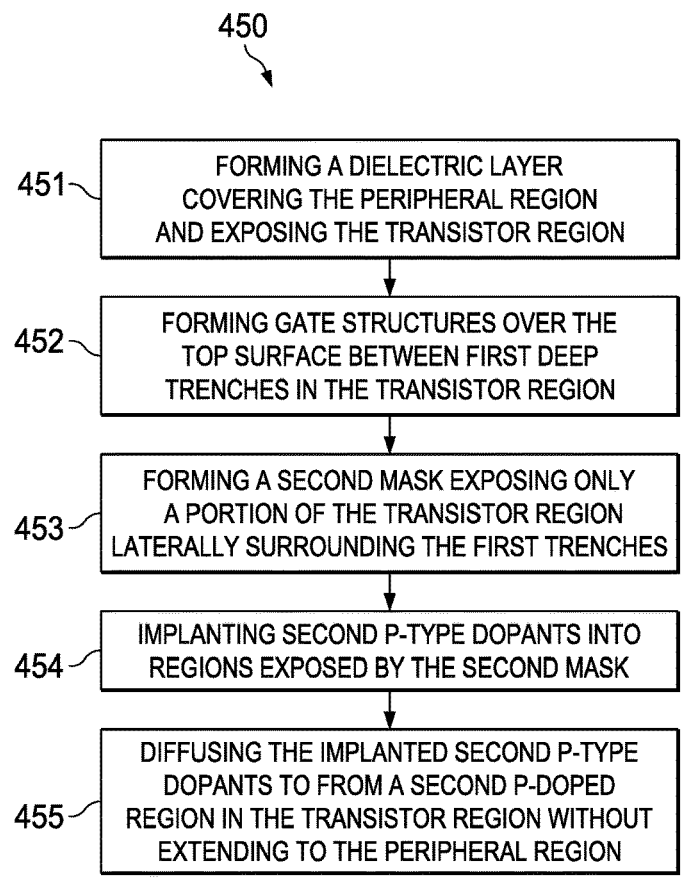

Referring again to FIG. 4A, in which the method 400 proceeds to step 450 upon completing step 440. Step 450 involves forming a second p-doped region in the transistor region without extending to the peripheral region. The second p-doped region abuts the p-doped field plates that are only positioned in the first deep trenches. According to an aspect of the present disclosure, step 450 may be implemented by a process flow as outlined in FIG. 4C, which may begin at step 451 and terminate at step 455.

Figure 5F:
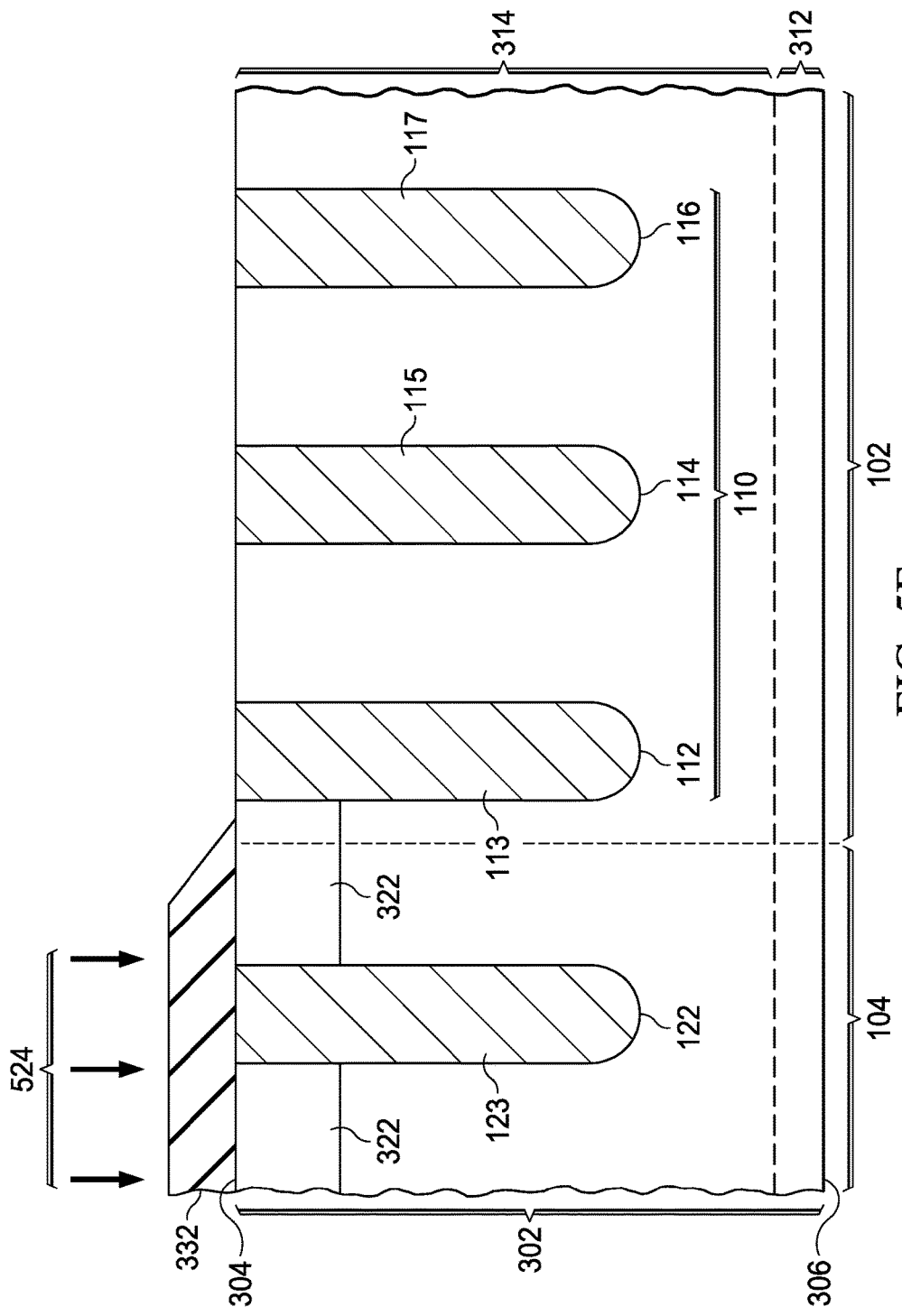

Step 451 involves forming a dielectric layer covering the peripheral region and exposing the transistor region. As shown in FIG. 5F, for example, a dielectric layer 332 is formed on the top surface 304 along the peripheral region 104. The dielectric layer 332 serves as an insulation means for insulating the underlying n-doped layer (i.e., the drain drift layer) 314. Terminating around the junction between the transistor region 102 and the peripheral region 104, the dielectric layer 332 circumscribes and exposes the transistor region 102.

The dielectric layer 332 may include an oxide layer that is formed by a patterned deposition of tetraethyl orthosilicate (TEOS). In one implementation, the patterned deposition of TEOS includes: depositing the TEOS material onto the top surface 304 to form a silicon oxide layer, followed by forming a photoresist mask on the top surface 304, followed by an buffered hydrofluoric acid (BHF) etch to expose the transistor region 102, followed by a plasma etch of silicon oxide that stops at the top surface 304. The plasma etch removed the silicon oxide outside of the peripheral region 104, thereby leaving behind the dielectric layer 332 under the unetched photoresist mask. After the plasma etch is performed, the unetched photoresist mask can be stripped.

Figure 5G:
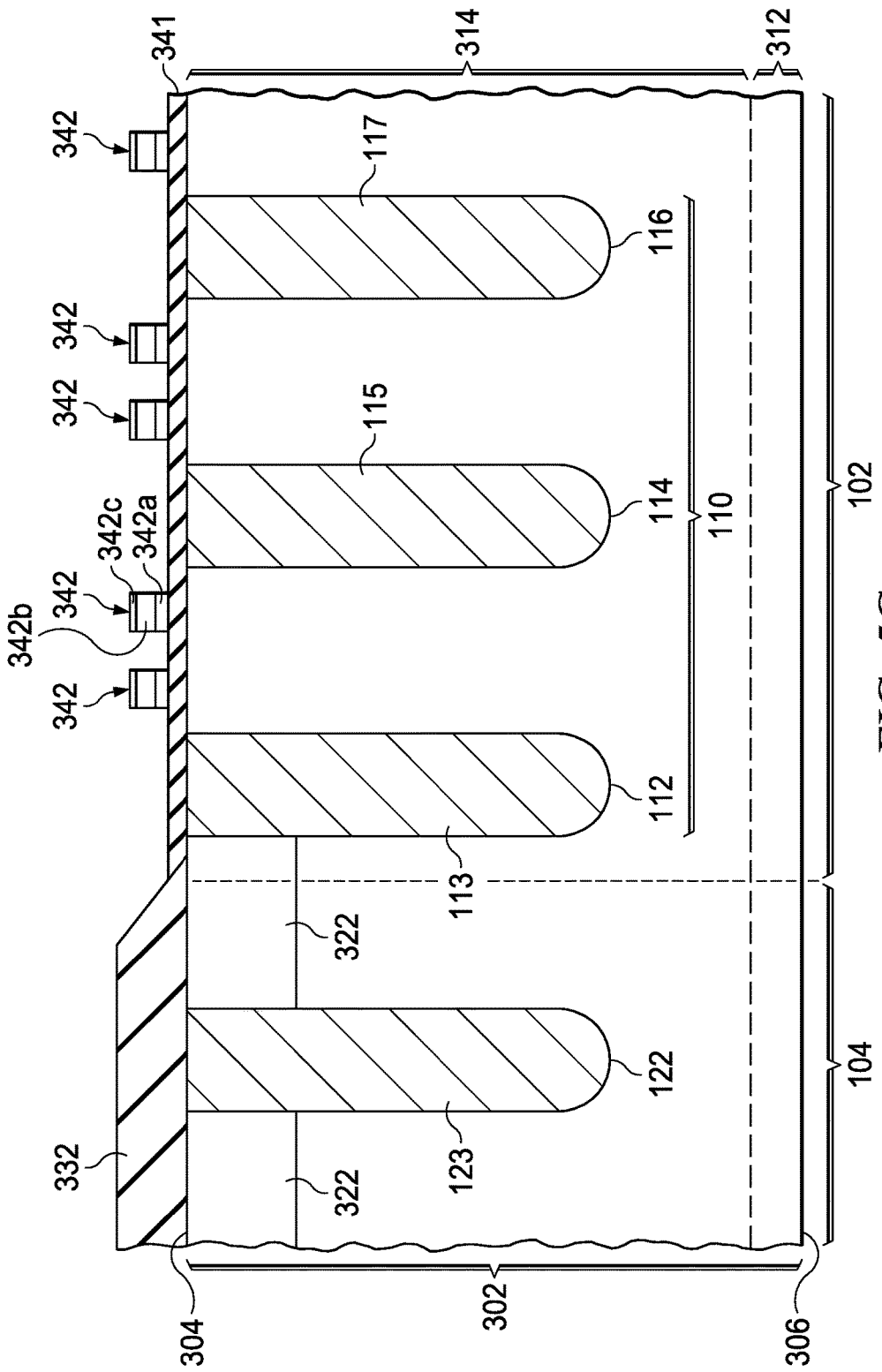

Step 452 involves forming gate structures over the top surface between first deep trenches in the transistor region. As shown in FIG. 5G, for example, one or more gate structures 342 are formed above the top surface 306 and in between two adjacent transistor body trenches 110, such as the transistor body trenches 112 and 114. The formation of the gate structures 342 may begin by performing a thermal oxidation to form a gate dielectric layer 341. Then, an in situ doped polysilicon deposition is performed to form a polysilicon layer of the gate structures 342. Next, a hydrofluoric (HF) de-glaze process is performed to pre-clean a surface of the polysilicon layer. After the HF de-glaze process, a chemical vapor deposition (CVD) of tungsten silicon (e.g., a $WSi_x$ layer, where x ranges from 2 um to 2.5 um) is performed to form a tungsten silicon layer on the pre-cleaned surface of the polysilicon layer.

To pattern the gate structures 342, a silicon oxide hard mask and a patterned photoresist mask are formed on the tungsten silicon layer, of which the patterned photoresist mask exposes regions that do not belong to the gate structures 342. Then, a hard mask etch is performed, which is followed by a tungsten silicon etch and a polysilicon etch that stop at the gate dielectric layer 341. After the gate structures 342 are patterned, the patterned photoresist mask is stripped. As a result, each gate structure 342 includes a polysilicon layer 342a on the gate dielectric layer 341, a tungsten silicon layer 342b on the polysilicon layer 342a, and an oxide layer 342c on the tungsten silicon layer 342b.

Figure 5H:
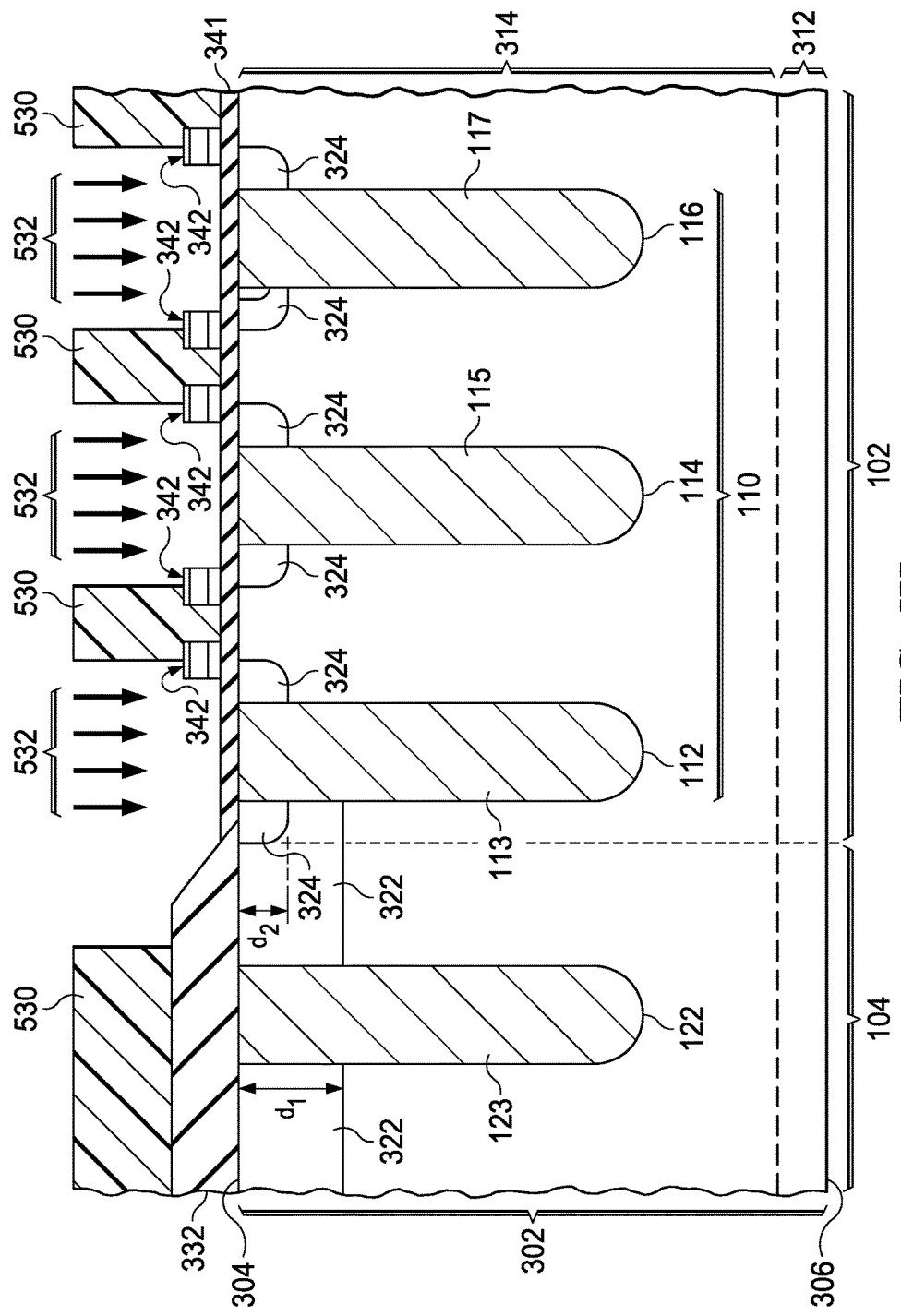
Figure 5I:
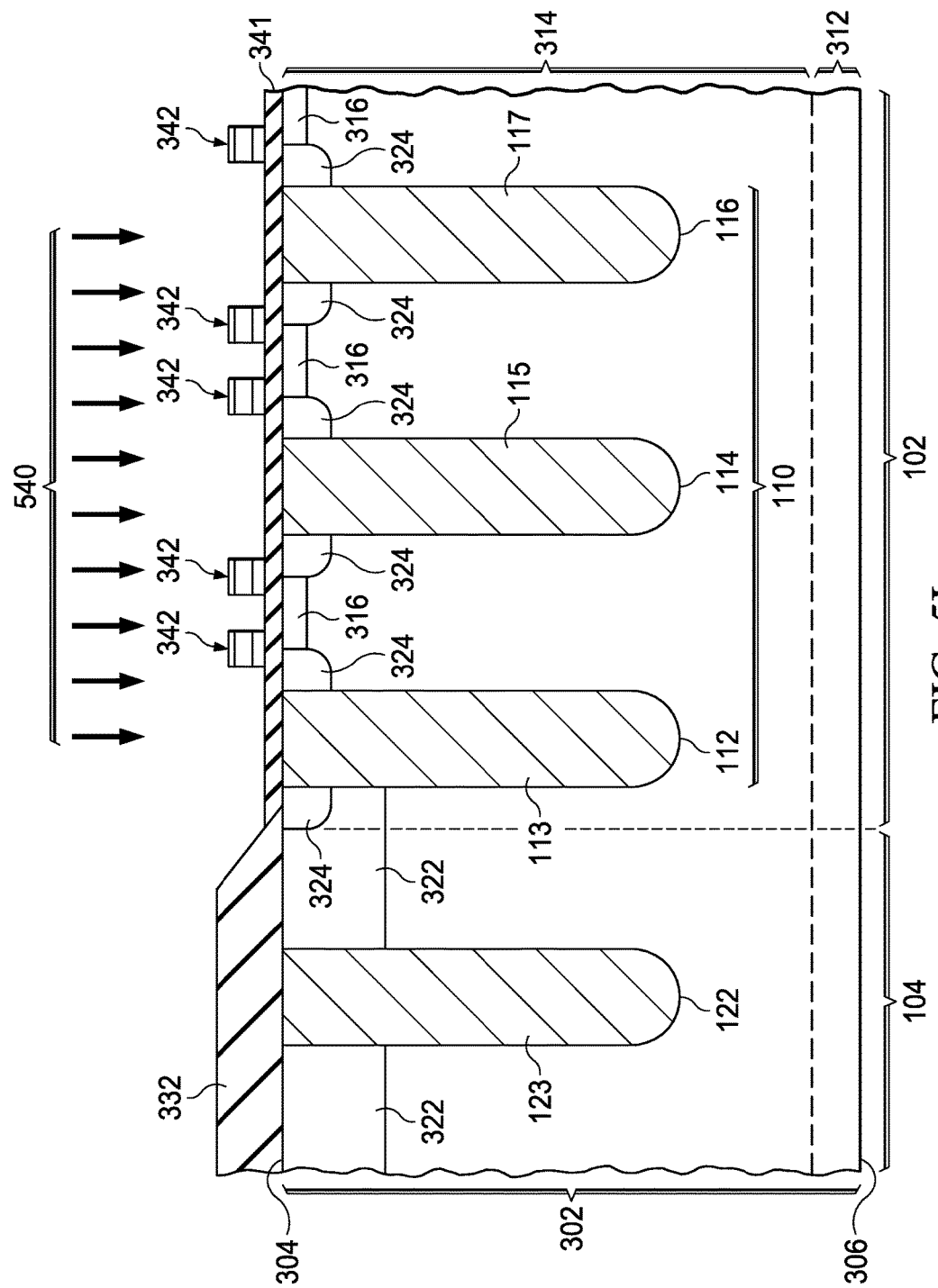

Step 453 involves forming a second mask exposing only a portion of the transistor region laterally surrounding the first trenches. As shown in FIG. 5H, for example, the second mask 530 exposes regions immediately adjacent to the transistor body trenches 110. Moreover, the dielectric layer 332 may serve as a mask alongside the second mask 530. This is because the dielectric layer 332 terminates around the junction between the transistor region 102 and the peripheral region 104. As such, the dielectric layer 332 exposes the transistor region 102 for the subsequent implantation.

Step 454 involves implanting second p-type dopants into regions exposed by the second mask. As shown in FIG. 5H, an implantation of p-type dopants 532 is performed through the openings defined by the second mask 530 and the dielectric layer 332. The p-type dopants may include boron. After that, the second mask 530 is removed while the dielectric layer 332 remains on the top surface 304 within the peripheral region 104.

Step 455 involves diffusing the implanted second p-type dopants to form a second p-doped region in the transistor region without extending to the peripheral region. As shown in FIG. 5H, the second p-doped regions (i.e., p-doped body regions) 324 are formed after an activation annealing process is performed. Each of the second p-doped regions 324 extends under the top surface 304. Around the device junction between the peripheral region 104 and the transistor region 102, the outmost second p-doped region 324 forms a contiguous p-doped region with the first p-doped region 322. The contiguous p-doped region spans across the device junction and abuts both the terminal trench 122 and the transistor body trench 112. Horizontally, each of the second p-doped regions 324 is interposed by one of the transistor body trenches 110, such as the transistor body trench 112. Vertically, the diffusion process causes each of the second p-doped regions 324 to have a diffusion depth d2 that ranges from 0.10 um to 0.30 um.

Referring again to FIG. 4A, in which the method 400 proceeds to step 460 upon completing step 450. Step 460 involves forming lightly n-doped regions between two adjacent gate structures. As shown in FIG. SI, for example, an implantation of n-type dopants 540 is performed. The n-type dopants include phosphorous, arsenic, and/or antimony. Each of the lightly n-doped regions (i.e., LDD regions) 318 is formed after an activation annealing process is performed. Each of the lightly n-doped regions 316 has a doping concentration lower than both the n-doped layer 314 and the n++ doped layer 312. In one implementation, each of the lightly n-doped regions 316 has a doping concentration ranging from $1 \times 10^{16}$ $cm^{-3}$ to $1 \times 10^{17}$ $cm^{-3}$. Horizontally, each of the lightly n-doped regions 316 spans between two adjacent second p-doped regions 324. Vertically, the diffusion process causes the lightly n-doped region 316 to extend from the top surface 304 to a shallow depth that is less that the diffusion depth d2 of the second p-doped region 324.

Figure 5J:
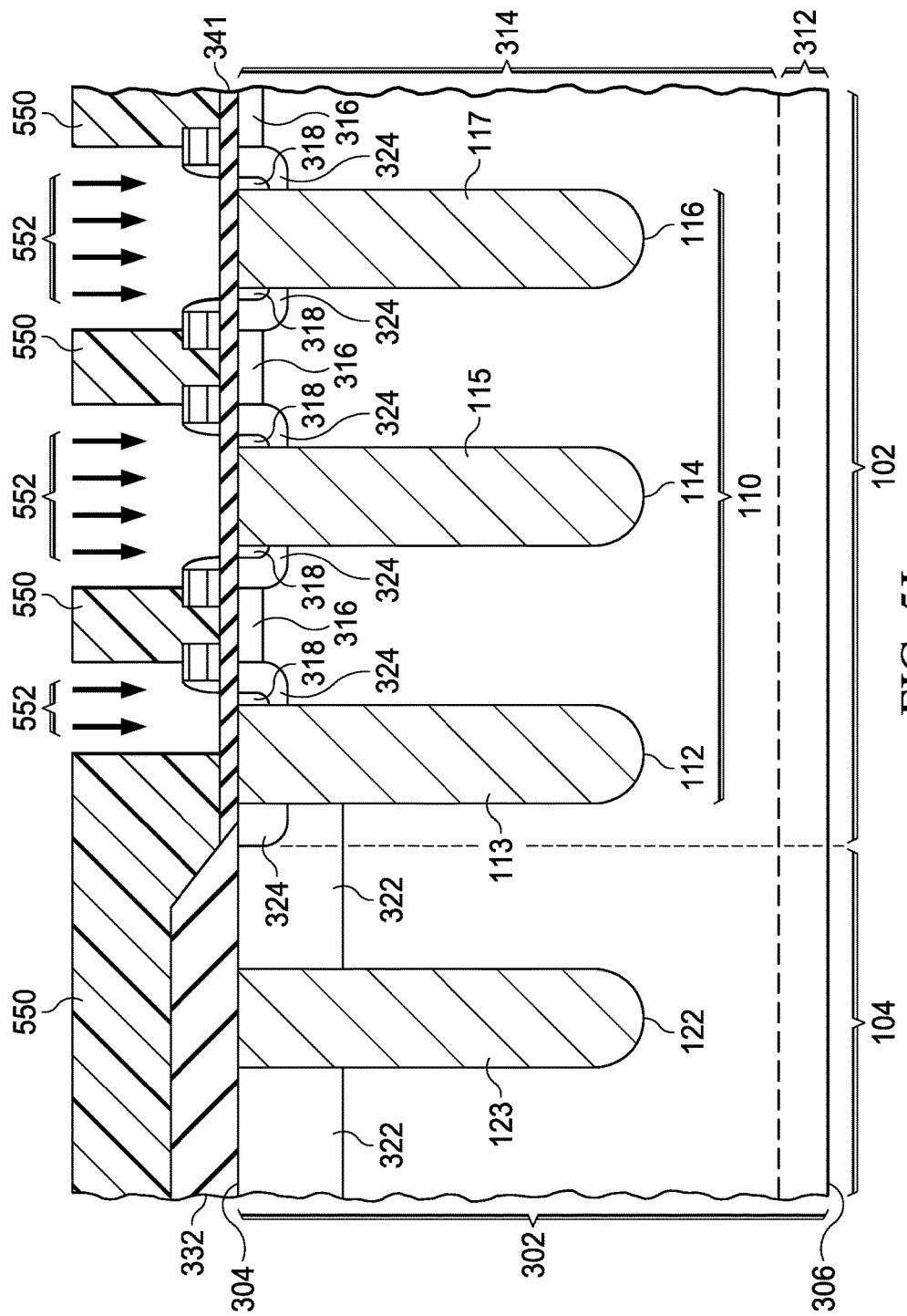

Upon completing step 460, the method 400 proceeds to step 470, which involves forming n-doped regions within the second p-doped regions and immediately adjacent to the first deep trenches. As shown in FIG. 5J, for example, a photoresist mask 550 is formed to define openings that expose regions immediately adjacent to the transistor body trenches 110. Moreover, the photoresist mask 550 covers the junction between the peripheral region 104 and the transistor region 102. As such, the photoresist mask 550 extends beyond the dielectric layer 332 to cover a portion of the transistor body trench 112. Next, an implantation of n-type dopants 552 is performed through the openings defined by the photoresist mask 550. The n-type dopants may include arsenic, phosphorus, and/or antimony. After that, the photoresist mask 550 is removed and an annealing process is performed. The annealing process diffused the implanted n-type dopants to form the n-doped regions (i.e., n-doped source regions) 318. Each of the n-doped regions 318 extends under the top surface 304. Horizontally and vertically, each of the n-doped regions 318 spans within the second p-doped region 324.

Figure 5K:
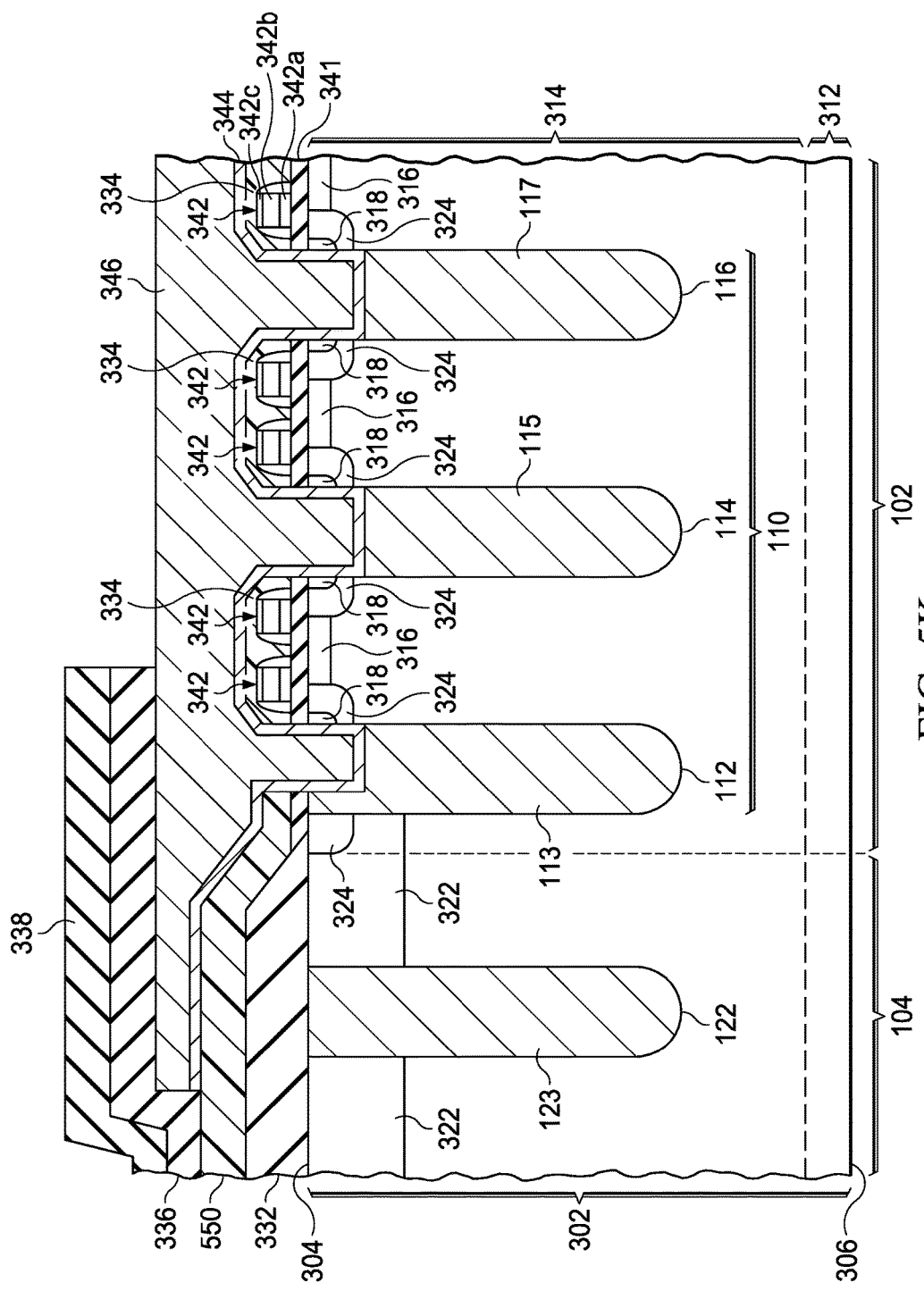

Upon completing step 470, the method 400 proceeds to step 480, which involves forming conductive layer insulated from the gate structures and coupled to the p-doped field plates in the first deep trenches. As shown in FIG. 5K, a stress relief layer 334 may be formed by TEOS deposition. The stress relief layer 334 also serves as an insulation layer for the gate structures 342 as well. Then a patterned silicon etch and a patterned silicon oxide etch are performed to remove an upper portion of each of the transistor body trenches 110. A barrier layer 344 may be deposited onto the stress relief layer 334 as well as the etched upper portion of each of the transistor body trenches 110. In one implementation, the barrier layer 344 may include a titanium nitride layer and a titanium layer. Next, a conductive layer 346 is deposited onto the barrier layer 344.

The conductive layer 346 is insulated from the gate structures 342, while making ohmic contacts with the n-doped regions 318, the second p-doped regions 324, and the transistor p-doped field plates 113, 115, and 117. The conductive layer 346 may serve as a source contact metal layer, and it may include an aluminum layer. After the conductive layer 346 is formed, a first insulation layer 336 and a second insulation layer 338 may be deposited to cover the stress relief layer 334 and the conductive layer 346. In one implementation, the first and second insulation layers 336 and 338 may cover the stress relief layer 334 and the conductive layer 346 above the peripheral region 104. In another implementation, the first and second insulation layers 336 and 338 may expose the conductive layer 346 above the transistor region 102. The first insulation layer 336 may include a phosphosilicate glass layer, and the second insulation layer 338 may include a silicon nitride layer.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:
1. A device, comprising:
   a semiconductor substrate having a top surface defining a transistor region and a peripheral region laterally surrounding the transistor region;
   an n-doped layer under the top surface;
   a first trench within the transistor region, the first trench extending from the top surface and partially penetrating the n-doped layer;
   a second trench within the peripheral region, the second trench coextending with the first trench;
   a first p-doped region adjacent to the top surface and abutting the first trench; and
   a second p-doped region adjacent to the top surface and abutting the first trench and the second trench.

2. The device of claim 1, wherein:
the first p-doped region having a first depth extending from the top surface; and
the second p-doped region having a second depth extending from the top surface and greater than the first depth.

3. The device of claim 1, wherein:
the first p-doped region having a first doping concentration; and
the second p-doped region having a second doping concentration lower than the first doping concentration.

4. The device of claim 1, wherein the second p-doped region is interposed between the first p-doped region and the second trench.

5. The device of claim 1, wherein the second p-doped region laterally surrounds the transistor region.

6. The device of claim 1, wherein the second p-doped region laterally surrounds the second trench.

7. The device of claim 1, further comprising:
an n-doped region positioned within the first p-doped region and abutting the first trench.

8. The device of claim 1, further comprising:
an n-doped region outside the first p-doped region and the peripheral region, the n-doped region positioned below the top surface and above the n-doped layer.

9. The device of claim 1, further comprising:
an oxide layer above the second trench and demarcating a boundary of the peripheral region, wherein the first p-doped region terminates around the boundary and the second p-doped region extends across the boundary.

10. The device of claim 1, wherein the second trench includes:
a longitudinal trench parallel to the first trench; and
a traverse trench perpendicular to the first trench, the traverse trench separated from the longitudinal trench, and the traverse trench staggering the longitudinal trench along a corner of the peripheral region.

11. A transistor, comprising:
an n-type drain contact layer;
an n-type drain layer on the n-type drain contact layer;
an oxide layer above the n-type drain layer and circumscribing a transistor region;
a p-type body region within the transistor region and near a top portion of the n-type drain layer;
a p-type terminal region extending from under the oxide layer to an edge of the transistor region, and forming a contiguous junction with the p-type body region;
body trenches within the transistor region and interleaving with the p-type body region; and
terminal trenches outside the transistor region and interleaving with the p-type terminal region.

12. The transistor of claim 11, wherein:
the p-type body region having a first depth extending from the top portion; and
the p-type terminal region having a second depth extending from the top portion and greater than the first depth.

13. The transistor of claim 11, wherein:
the p-type body region having a first doping concentration; and
the p-type terminal region having a second doping concentration lower than the first doping concentration.

14. The transistor of claim 11, further comprising:
an n-type source region positioned within the p-type body region and accessing the body trenches.

15. The transistor of claim 11, further comprising:
an n-type lightly doped drain (LDD) region outside the p-type body region and interposed between two of the body trenches.

16. The transistor of claim 11, wherein the terminal trenches includes:
longitudinal trenches parallel to the body trenches; and
traverse trenches perpendicular to the body trenches, the traverse trenches isolated from the longitudinal trenches, and the traverse trenches arrange with the longitudinal trenches a staggering pattern embracing a corner of the transistor region.

17. An integrated circuit, comprising:
an n-type drain contact layer;
an n-type drain layer on the n-type drain contact layer;
an oxide layer above the n-type drain layer and circumscribing transistor regions; and
transistors, each including:
a p-type body region within at least one of the transistor regions and near a top portion of the n-type drain layer;
a p-type terminal region extending from under the oxide layer to an edge of at least one of the transistor regions, and forming a contiguous junction with the p-type body region;
body trenches within at least one of the transistor regions and interleaving with the p-type body region; and
terminal trenches outside at least one of the transistor regions and interleaving with the p-type terminal region.

18. The integrated circuit of claim 17, wherein:
the p-type body region having a first depth extending from the top portion; and
the p-type terminal region having a second depth extending from the top portion and greater than the first depth.

19. The integrated circuit of claim 17, wherein:
the p-type body region having a first doping concentration; and
the p-type terminal region having a second doping concentration lower than the first doping concentration.

20. The integrated circuit of claim 17, wherein the terminal trenches includes:
longitudinal trenches parallel to the body trenches; and
traverse trenches perpendicular to the body trenches, the traverse trenches isolated from the longitudinal trenches, and the traverse trenches arrange with the longitudinal trenches a staggering pattern embracing a corner of each of the transistor regions.

* * * * *